(12) United States Patent
Casper et al.

(10) Patent No.: US 7,457,393 B2
(45) Date of Patent: Nov. 25, 2008

(54) CLOCK RECOVERY APPARATUS, METHOD, AND SYSTEM

(75) Inventors: Bryan K. Casper, Hillsboro, OR (US);
Aaron K. Martin, Hillsboro, OR (US);
Stephen R. Mooney, Beaverton, OR (US); James E. Jaussi, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 836 days.

(21) Appl. No.: 11/025,771

(22) Filed: Dec. 29, 2004

(65) Prior Publication Data
US 2006/0140324 A1 Jun. 29, 2006

(51) Int. Cl.
*H03D 3/24* (2006.01)

(52) U.S. Cl. .................. 375/376; 375/326; 327/156
(58) Field of Classification Search .......... 375/373, 375/376, 326, 327; 327/156
See application file for complete search history.

(56) References Cited

U.S. PATENT DOCUMENTS 6,900,676 B1 * 5/2005 Tamura ............... 327/156

* cited by examiner

*Primary Examiner*—Kevin Y Kim
(74) *Attorney, Agent, or Firm*—Dana B. Lemoine; Lemoine Patent Services, PLLC (57) ABSTRACT

A global clock recovery circuit and port circuit determine and combine static phase adjustment information and dynamic phase adjustment information for multiple data signals. Static phase adjustment information is determined for each of the multiple data signals, and dynamic phase adjustment information is determined in common for the multiple data signals.

16 Claims, 7 Drawing Sheets

FIG. 7

CLOCK RECOVERY APPARATUS, METHOD, AND SYSTEM

FIELD

The present invention relates generally to electronic circuits, and more specifically to communications between electronic circuits.

BACKGROUND

Within electronic systems, integrated circuits typically communicate with each other using electrical signals. A typical electrical signal is transmitted by one integrated circuit and received by another integrated circuit. A clock signal may be used to determine when to sample the electrical signal at the receiving integrated circuit. If the clock signal is offset in either frequency or phase, communications errors may result.

DESCRIPTION OF EMBODIMENTS

In the following detailed description, reference is made to the accompanying drawings that show, by way of illustration, specific embodiments in which the invention may be practiced. These embodiments are described in sufficient detail to enable those skilled in the art to practice the invention. It is to be understood that the various embodiments of the invention, although different, are not necessarily mutually exclusive. For example, a particular feature, structure, or characteristic described herein in connection with one embodiment may be implemented within other embodiments without departing from the spirit and scope of the invention. In addition, it is to be understood that the location or arrangement of individual elements within each disclosed embodiment may be modified without departing from the spirit and scope of the invention. The following detailed description is, therefore, not to be taken in a limiting sense, and the scope of the present invention is defined only by the appended claims, appropriately interpreted, along with the full range of equivalents to which the claims are entitled. In the drawings, like numerals refer to the same or similar functionality throughout the several views.

Figure 1:
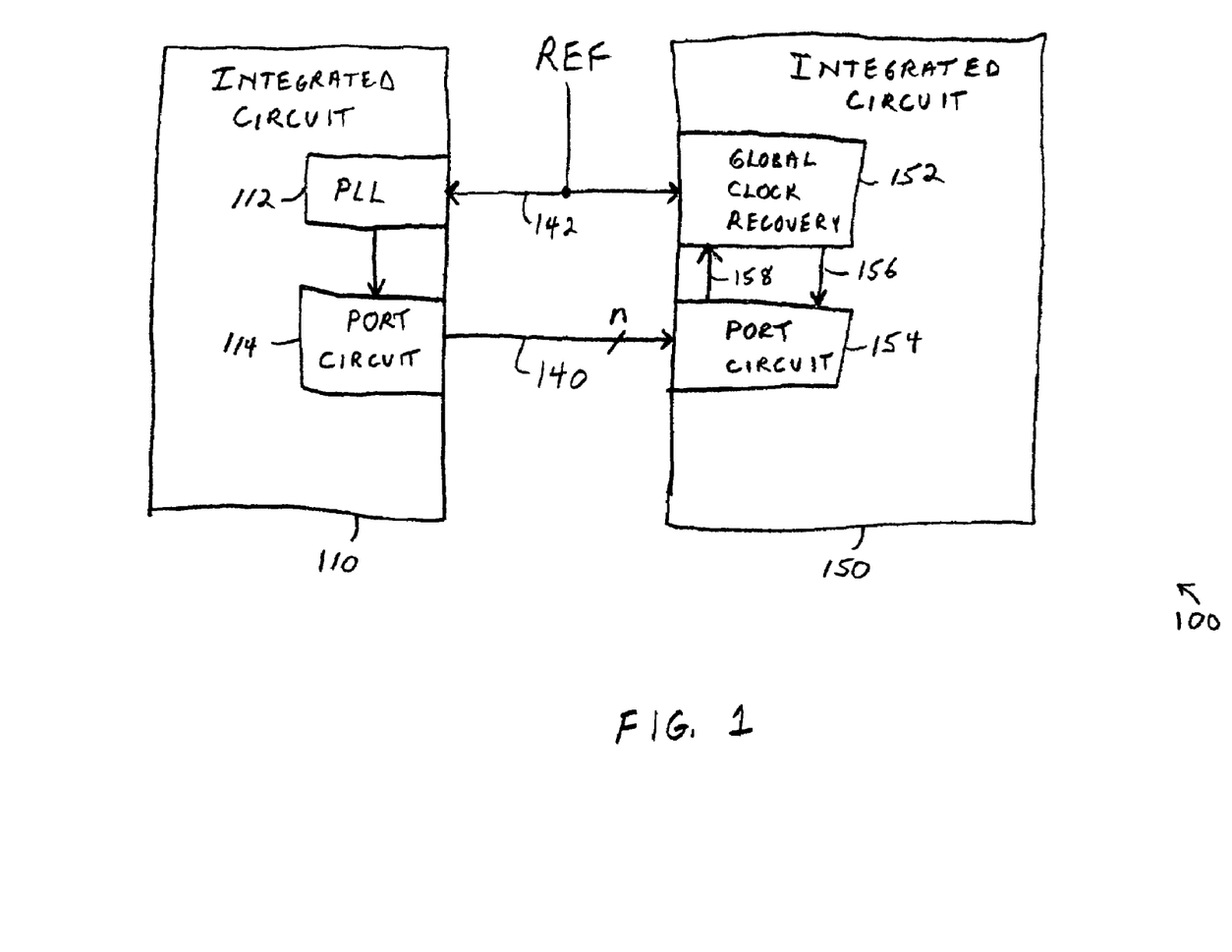
FIG. 1 shows an electronic system having two integrated circuits with port circuits.

FIG. 1 shows an electronic system having two integrated circuits with port circuits. Integrated circuit 110 includes port circuit 114, and phase locked loop (PLL) circuit 112, and integrated circuit 150 includes port circuit 154 and global clock recovery circuit 152. In some embodiments, a reference clock signal (REF) on node 142 is provided to both integrated circuits 110 and 150, and both integrated circuits derive one or more clock signals from the reference clock signal.

Port circuits 114 and 154 are interconnected by bus 140. Bus 140 is shown in FIG. 1 having "n" signal lines, where "n" is any number. Also as shown in FIG. 1, port circuit 114 is an output circuit, and port circuit 154 is an input circuit, although this is not a limitation of the present invention. For example, one or more of port circuits 114 and 154 may be a bi-directional port circuit.

Port circuit 114 may include circuitry to transmit multiple signals. For example, port circuit 114 may be a sixteen bit port that transmits sixteen signals, a thirty-two bit port that transmits thirty-two signals, or any other size port. In some embodiments, PLL 112 may receive the reference clock signal on node 142, and provide a clock to port circuit 114, and port circuit 114 may use the clock to time transmissions of signals. For example, sequential elements such as flip-flops may be included in port circuit 114, and may also be clocked with a clock signal provided by PLL 112.

Due to variations in circuit elements and operating characteristics, PLL 112 may exhibit variations in phase and frequency. For example, PLL 112 may exhibit phase noise, and that phase noise may translate into phase noise on signals transmitted onto bus 140. In addition to phase noise, the signals on bus 140 may also be subjected to delay or phase shifts relative to each other as a function of transmission path differences. For example, the lengths of physical conductors and variations in circuit elements may introduce differing amounts of signal delay for the various signals on bus 140.

Port circuit 154 receives the signals transmitted onto bus 140. In some embodiments, port circuit 154 and global clock recovery circuit 152 interact to counteract the combined influences of phase noise common to all received signals, and phase shift unique to each signal. For example, global clock recovery circuit 152 may provide one or more clock signals 156 to port circuit 154, and port circuit 154 may in turn provide phase offset information 158 to global clock recovery circuit 152 corresponding to a plurality of separate phase offsets. Various embodiments of global clock recovery circuit 152 and port circuit 154 are described below with reference to the remaining figures.

Figure 2:
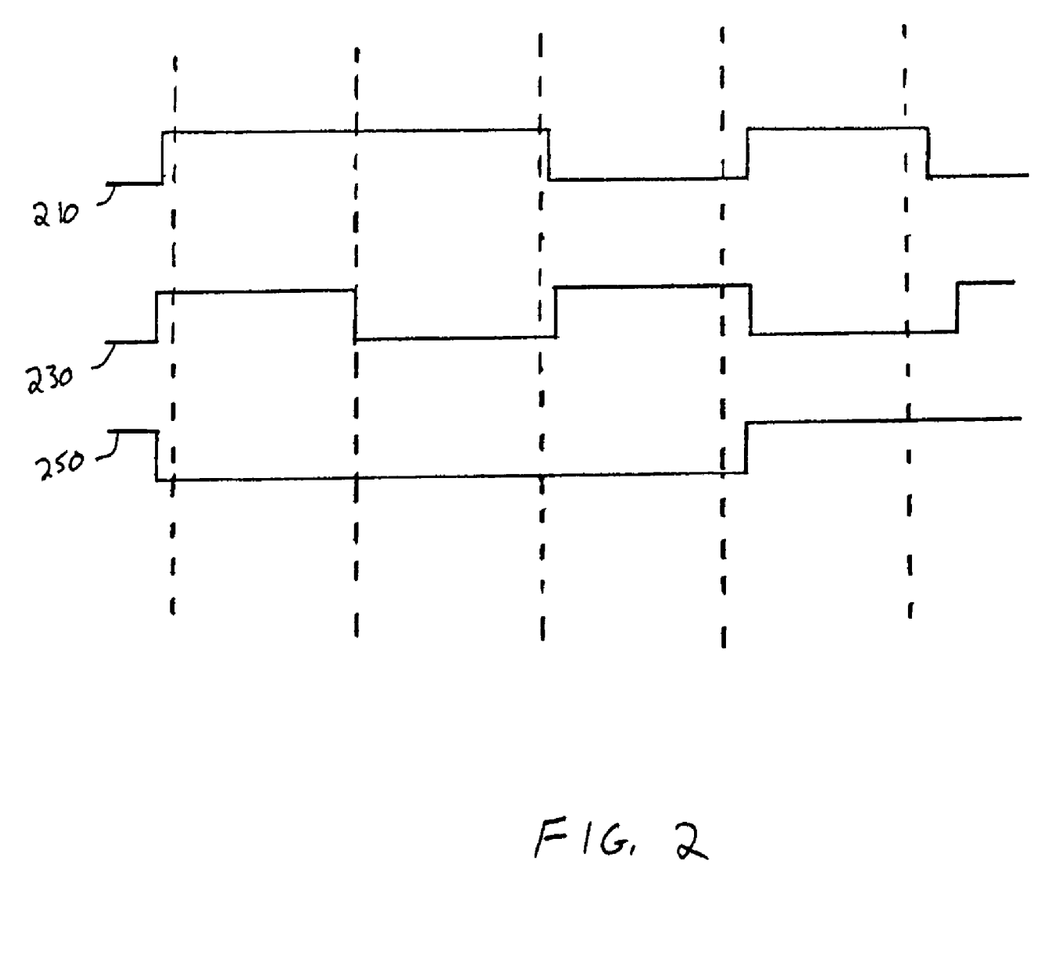
FIG. 2 shows example signal waveforms.

FIG. 2 shows example signal waveforms. Waveforms 210, 230, and 250 represent examples of digital signals that may be driven onto bus 140 (FIG. 1) and received by a port circuit such as port circuit 154 (FIG. 1). The dashed lines in FIG. 2 represent transitions of a clock signal. For example, the dashed lines may represent a phase-shifted version of reference clock signal REF (FIG. 1). As shown in FIG. 2, the various received digital signals may not always align in phase with one recovered clock signal. In some embodiments, the recovered clock signal and the digital signals may have phase offsets relative to each other that may or may not change with time. In some embodiments of the present invention, a clock recovery circuit may recover a clock signal that corresponds to the dashed lines in FIG. 2, and that clock signal may be used to derive clock signals to receive digital signals at a port circuit.

Various embodiments of the present invention provide global clock recovery to generate one or more clock signals for use in a port circuit, and also provide one or more loop circuits within the port circuit to control phase offsets. Both static and dynamic phase offsets may be compensated for, both at the port level and at the bit level.

Figure 3:
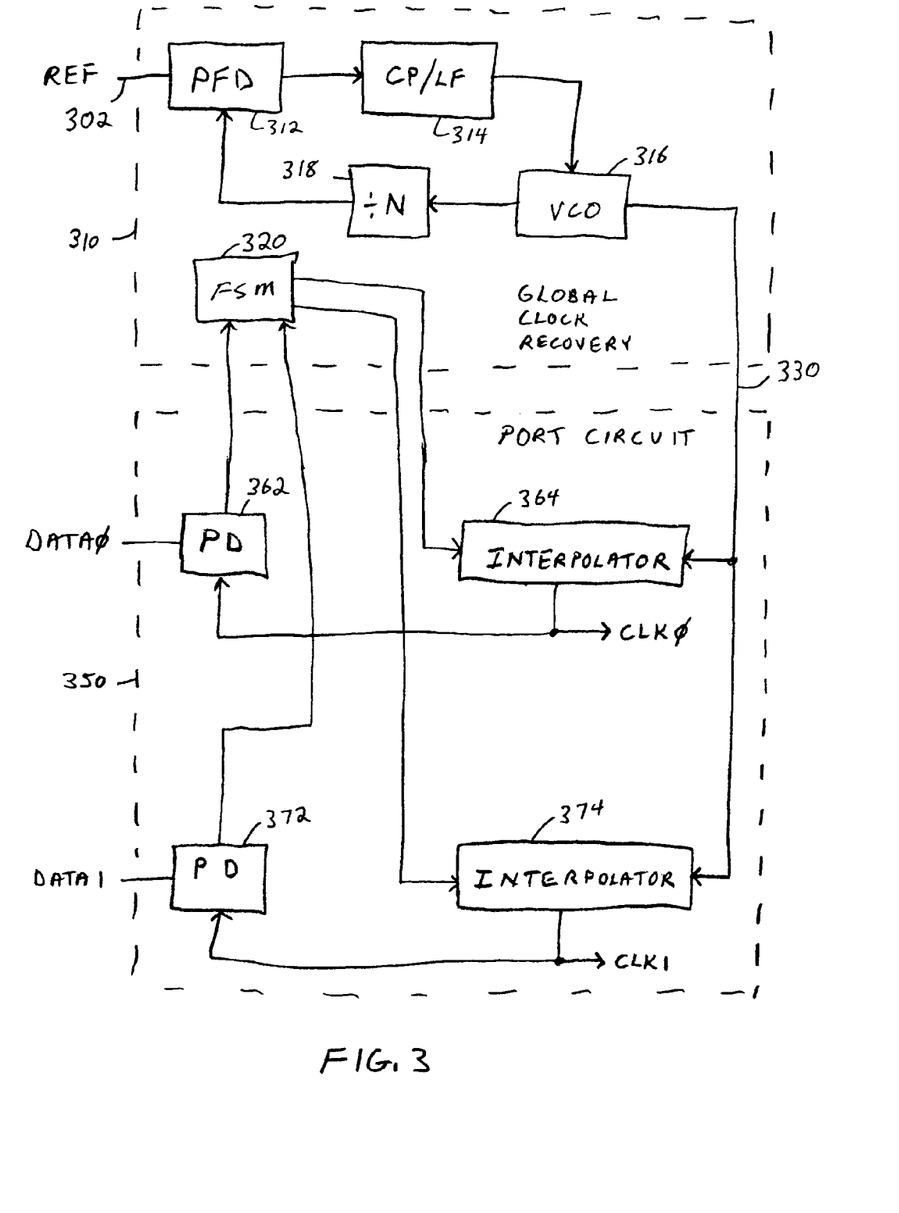
FIGS. 3-5 show clock recovery circuits and port circuits in accordance with various embodiments of the present invention.

FIG. 3 shows a clock recovery circuit and port circuit in accordance with various embodiments of the present invention. Global clock recovery circuit 310 and port circuit 350 may be utilized together in an integrated circuit such as integrated circuit 150 (FIG. 1). For example, global clock recovery circuit 310 may correspond to global clock recovery circuit 152 (FIG. 1), and port circuit 350 may correspond to port circuit 154 (FIG. 1).

Global clock recovery circuit 310 includes phase frequency detector (PFD) 312, charge pump/loop filter (CP/LF)

314, voltage controlled oscillator (VCO) 316, frequency divider 318, and finite state machine (FSM) 320. Port circuit 350 includes phase detectors (PD) 362 and 372, and interpolators 364 and 374.

In operation, clock recovery circuit 310 receives a reference clock signal on node 302 and produces one or more clock signals on node 330. The clock signals on node 330 may be clock signals having predefined phase offsets. For example, node 330 may include four clock signals that vary in phase from each other by substantially 90 degrees. Also for example, node 330 may include eight clock signals that vary in phase from each other by substantially 45 degrees. Node 330 may include any number of clock signals having any phase relationship without departing from the scope of the present invention.

Port circuit 350 receives the clock signals on node 330, and generates a clock signal for each data signal received. As shown in FIG. 3, data signal DATA0 is received by a loop circuit that includes PD 362 and interpolator 364, and data signal DATA1 is received by a loop circuit that includes PD 372 and interpolator 374. Interpolators 364 and 374 receive the clock signals on node 330 and produce clock signals CLK0 and CLK1, respectively.

In some embodiments, interpolators 364 and 374 may select one of the clock signals on node 330 to supply as CLK0 or CLK1, respectively. In other embodiments, interpolators 364 and 374 may interpolate between clock signals on node 330 to produce a clock signal having a phase that is between the phases of two of the clock signals on node 330. Interpolators 364 and 374 receive phase adjustment information from FSM 320 within global clock recovery circuit 310, and the phase adjustment information is utilized to determine the proper phase for CLK0 and CLK1. The phase adjustment information is described further below.

In some embodiments, VCO 316 provides a single clock signal on node 330, and each of interpolators 364 and 374 includes a delay lock loop (DLL) to produce multiple clock signals with various phases. In these embodiments, the interpolators may utilize the phase adjustment information to interpolate between clock signals generated locally by a DLL.

Each of the loop circuits in port circuit 350 provides phase offset information to global clock recovery circuit 310, which in turn provides phase adjustment information back to each loop circuit in port circuit 350. For example, PD 362 compares the phase of data signal DATA0 and clock signal CLK0, and provides phase offset information to FSM 320. Also for example, PD 372 compares the phase of data signal DATA1 and clock signal CLK1, and provides phase offset information to FSM 320.

Phase adjustment information may include static and dynamic adjustment information. For example, static adjustment information may be provided that is different for each loop circuit to compensate for static phase offset differences between the received data signals. Also for example, dynamic phase adjustment information may be provided in common to each loop circuit. The dynamic adjustment information may compensate for phase differences that all of the received data signals have in common. For example, dynamic phase adjustment information may compensate for phase noise common to all received data signals.

In some embodiments, the phase offset information received from the loop circuits may be averaged by the finite state machine. For example, FSM 320 may receive phase offset information from each loop circuit in port circuit 350, and may average that offset information to determine the dynamic phase adjustment information to be provided to all interpolators in common. Further, in some embodiments, FSM 320 may sum dynamic phase adjustment with static phase adjustment information for each loop circuit, and provide the resulting adjustment information to each interpolator.

Each loop circuit produces a clock signal that is suitable to clock the corresponding data signal. For example, CLK0 is a clock signal having dynamic and static phase adjustment suitable to clock a sequential element (not shown) that captures DATA0. Also for example, CLK1 is a clock signal having dynamic and static phase adjustment suitable to clock a sequential element (not shown) that captures DATA1.

In some embodiments, static phase adjustment information may be derived by receiving a training sequence of data. For example, referring now back to FIG. 1, port circuit 114 may transmit a known sequence that is received by port circuit 154, and the combination of global clock recovery circuit 152 and port circuit 154 may arrive at the static phase adjustment for each loop in port circuit 154. In subsequent operation, the static phase adjustments may be applied to each loop circuit in port circuit 154. Further, the static phase adjustments may be summed with dynamic phase adjustment information that is common to all loop circuits in port circuit 154.

Figure 4:
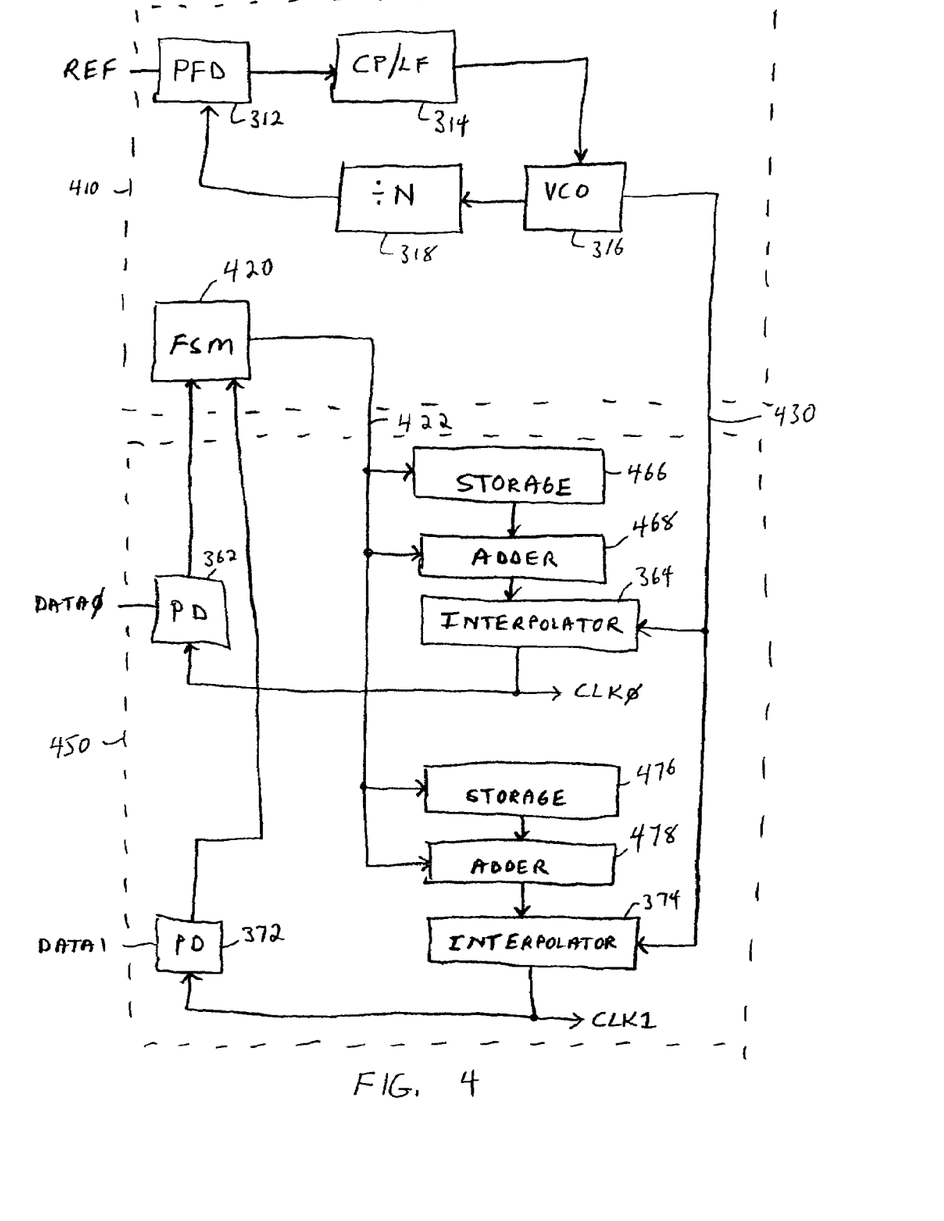

FIG. 4 shows a clock recovery circuit and port circuit in accordance with various embodiments of the present invention. Global clock recovery circuit 410 and port circuit 450 may be utilized together in an integrated circuit such as integrated circuit 150 (FIG. 1). For example, global clock recovery circuit 410 may correspond to global clock recovery circuit 152 (FIG. 1), and port circuit 450 may correspond to port circuit 154 (FIG. 1).

Global clock recovery circuit 410 includes phase frequency detector (PFD) 312, charge pump/loop filter (CP/LF) 314, voltage controlled oscillator (VCO) 316, frequency divider 318, and finite state machine (FSM) 420. Port circuit 450 includes phase detectors (PD) 362 and 372, interpolators 364 and 374, storage elements 466 and 476, and adders 468 and 478.

In operation, clock recovery circuit 410 receives a reference clock signal and produces one or more clock signals on node 430. The clock signals on node 430 may be clock signals having predefined phase offsets. For example, node 430 may include four clock signals that vary in phase from each other by substantially 90 degrees. Also for example, node 430 may include eight clock signals that vary in phase from each other by substantially 45 degrees. Node 430 may include any number of clock signals having any phase relationship without departing from the scope of the present invention.

Port circuit 450 receives the clock signals on node 430, and generates a clock signal for each data signal received. As shown in FIG. 4, data signal DATA0 is received by a loop circuit that includes PD 362, storage element 466, adder 468, and interpolator 364; and data signal DATA1 is received by a loop circuit that includes PD 372, storage element 476, adder 478, and interpolator 374. Interpolators 364 and 374 receive the clock signals on node 430 and produce clock signals CLK0 and CLK1, respectively.

Each of the loop circuits in port circuit 450 provides phase offset information to global clock recovery circuit 410, which in turn provides phase adjustment information back to each loop circuit in port circuit 450. For example, PD 362 compares the phase of data signal DATA0 and clock signal CLK0, and provides phase offset information to FSM 420. Also for example, PD 372 compares the phase of data signal DATA1 and clock signal CLK1, and provides phase offset information to FSM 420. Finite state machine 420 provides phase adjustment information to the various loop circuits on node 422.

Phase adjustment information on node 422 may include static and dynamic adjustment information. For example, static adjustment information may be provided that is different for each loop circuit to compensate for static phase offset differences between the received data signals. Also for example, dynamic phase adjustment information may be provided in common to each loop circuit. The dynamic adjustment information may compensate for phase offsets that all of the received data signals have in common.

Interpolators 364 and 374 produce clock signals CLK0 and CLK1 in response to a combination of static and dynamic phase adjustment information received from adders 468 and 478, respectively. In some embodiments, storage elements 466 and 476 receive static phase adjustment information from FSM 420 within global clock recovery circuit 410, and adders 468 and 478 receive dynamic phase adjustment information from FSM 420.

In some embodiments, VCO 316 provides a single clock signal on node 430, and each of interpolators 364 and 374 includes a delay lock loop (DLL) to produce multiple clock signals with various phases. In these embodiments, the interpolators may utilize the phase adjustment information to interpolate between clock signals generated locally by a DLL.

In some embodiments, the phase offset information received from the loop circuits may be averaged by the finite state machine. For example, FSM 420 may receive phase offset information from each loop circuit in port circuit 450, and may average that offset information to determine the dynamic phase adjustment information to be provided to all adders in common.

In some embodiments, static phase adjustment information may be derived by receiving a training sequence of data. For example, referring now back to FIG. 1, port circuit 114 may transmit a known sequence that is received by port circuit 154, and the combination of global clock recovery circuit 152 and port circuit 154 may arrive at the static phase adjustment for each loop in port circuit 154. The static phase adjustments may be stored in the appropriate storage elements. For example, a static phase adjustment corresponding to DATA0 may be stored in storage element 466, and a static phase adjustment corresponding to DATA1 may be stored in storage element 476.

Figure 5:
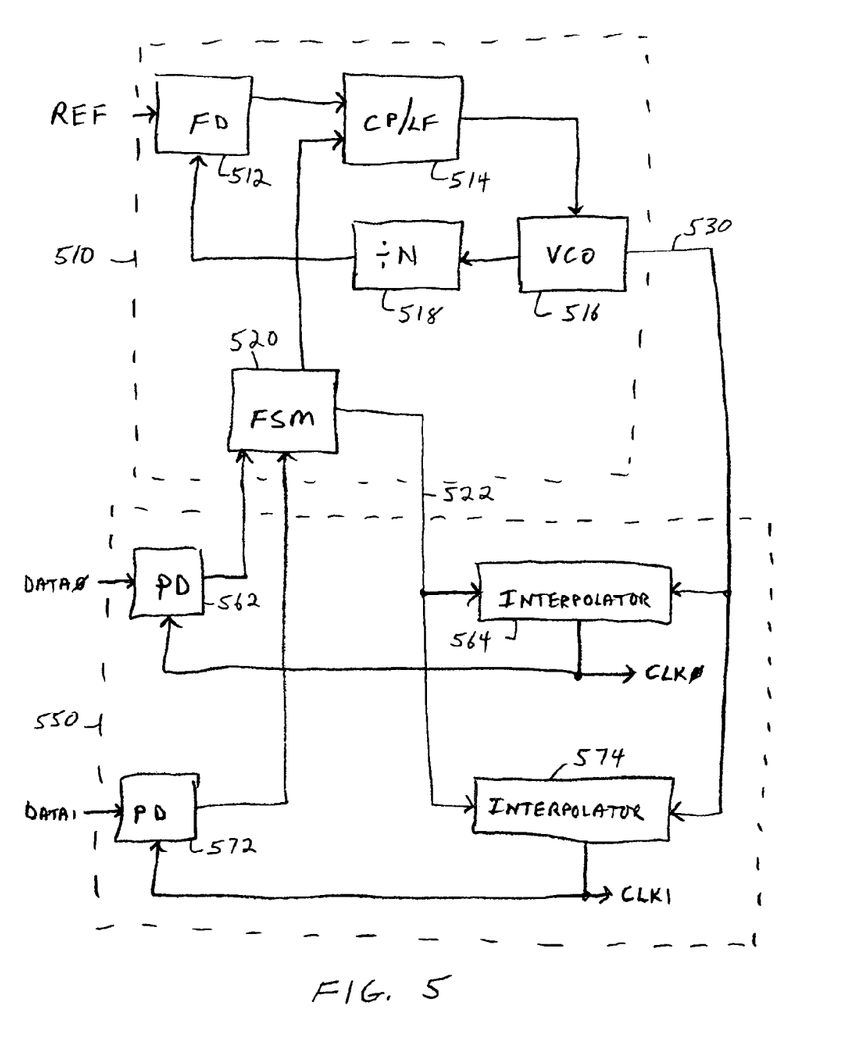

FIG. 5 shows a clock recovery circuit and port circuit in accordance with various embodiments of the present invention. Global clock recovery circuit 510 and port circuit 550 may be utilized together in an integrated circuit such as integrated circuit 150 (FIG. 1). For example, global clock recovery circuit 510 may correspond to global clock recovery circuit 152 (FIG. 1), and port circuit 550 may correspond to port circuit 154 (FIG. 1).

Global clock recovery circuit 510 includes frequency detector (FD) 512, charge pump/loop filter (CP/LF) 514, voltage controlled oscillator (VCO) 516, frequency divider 518, and finite state machine (FSM) 520. Port circuit 550 includes phase detectors (PD) 562 and 572, and interpolators 564 and 574.

In operation, global clock recovery circuit 510 receives a reference clock signal and produces one or more clock signals on node 530. The clock signals on node 530 may be clock signals having predefined phase offsets. For example, node 530 may include four clock signals that vary in phase from each other by substantially 90 degrees. Also for example, node 530 may include eight clock signals that vary in phase from each other by substantially 45 degrees. Node 530 may include any number of clock signals having any phase relationship without departing from the scope of the present invention.

Port circuit 550 receives the clock signals on node 530, and generates a clock signal for each data signal received. As shown in FIG. 5, data signal DATA0 is received by a loop circuit that includes PD 562 and interpolator 564; and data signal DATA1 is received by a loop circuit that includes PD 572 and interpolator 574. Interpolators 564 and 574 receive the clock signals on node 530 and produce clock signals CLK0 and CLK1, respectively.

Each of the loop circuits in port circuit 550 provides phase offset information to global clock recovery circuit 510, which dynamically adjusts the phase of the clock signals on node 530. For example, PD 562 compares the phase of data signal DATA0 and clock signal CLK0, and provides phase offset information to FSM 520. Also for example, PD 572 compares the phase of data signal DATA1 and clock signal CLK1, and provides phase offset information to FSM 520. Finite state machine 520 provides dynamic phase adjustment information to CP/LF 514, and also provides static phase adjustment information to the various loop circuits on node 522. Although node 522 is shown as a single line in FIG. 5, the present invention is not limited in this regard. For example, node 522 may include any number of physical conductors, busses, or signals lines.

Interpolators 564 and 574 produce clock signals CLK0 and CLK1 in response to static phase adjustment information received from FSM 520. In some embodiments, the clock signals received on node 530 vary dynamically as a result of the phase offset information produced by the various phase detectors shown in FIG. 5.

In some embodiments, VCO 516 provides a single clock signal on node 530, and each of interpolators 564 and 574 includes a delay lock loop (DLL) to produce multiple clock signals with various phases. In these embodiments, the interpolators may utilize the static phase adjustment information to interpolate between clock signals generated locally by a DLL.

In some embodiments, the phase offset information received from the loop circuits may be averaged by the finite state machine. For example, FSM 520 may receive phase offset information from each loop circuit in port circuit 550, and may average that offset information to determine the dynamic phase adjustment information to be provided to CP/LF 514.

In some embodiments, static phase adjustment information may be derived by receiving a training sequence of data. For example, referring now back to FIG. 1, port circuit 114 may transmit a known sequence that is received by port circuit 154, and the combination of global clock recovery circuit 152 and port circuit 154 may arrive at the static phase adjustment for each loop in port circuit 154. The static phase adjustments may be provided to the interpolators on node 522. Further, the static phase adjustments may be stored in storage elements, such as the storage shown in FIG. 4. For example, a static phase adjustment corresponding to DATA0 may be provided to interpolator 564, and a static phase adjustment corresponding to DATA1 may be provided to interpolator 574.

Figure 6:
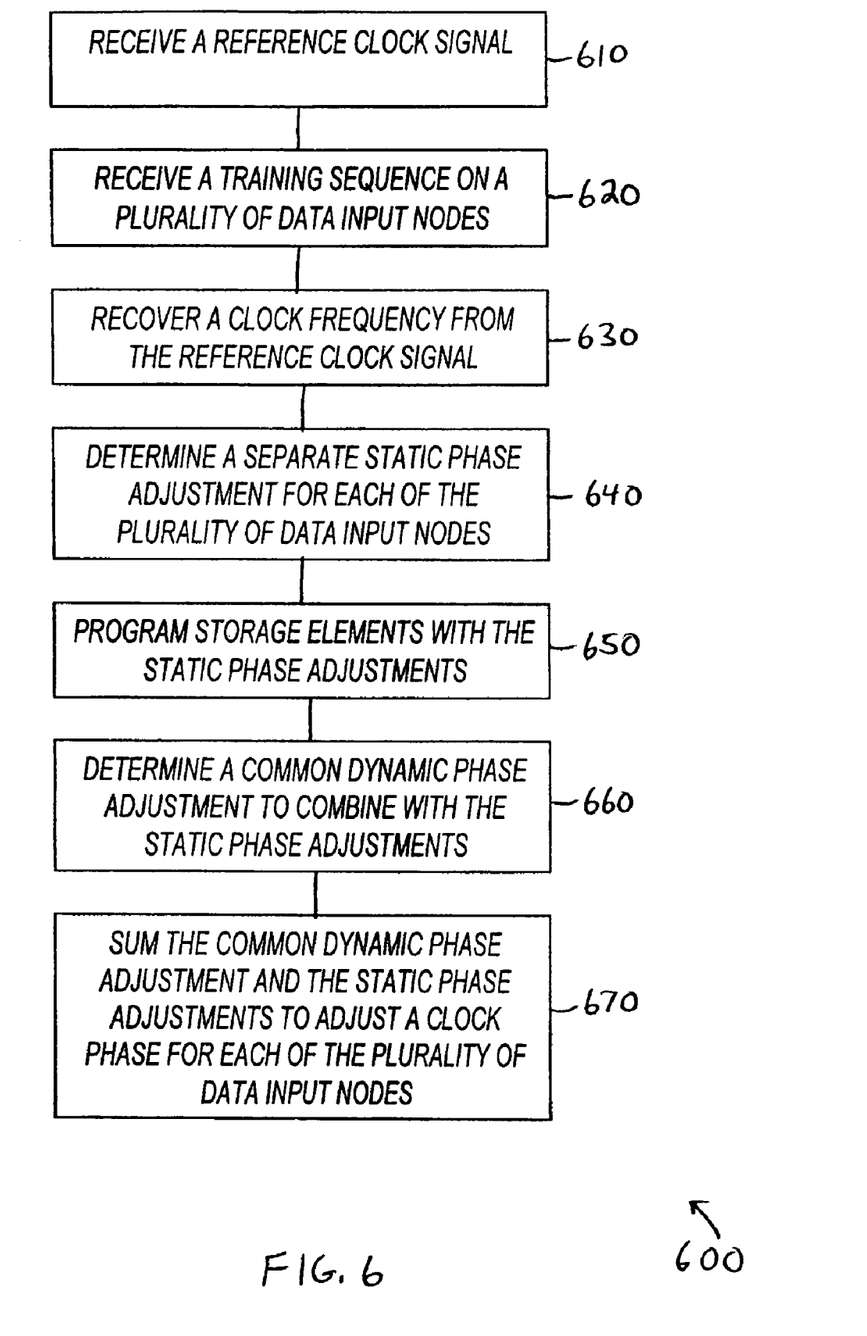
FIG. 6 shows a flowchart in accordance with various embodiments of the present invention.

FIG. 6 shows a flowchart in accordance with various embodiments of the present invention. In some embodiments, method 600 may be used to recover one or more clock signals in an integrated circuit. In some embodiments, method 600, or portions thereof, is performed by an integrated circuit, embodiments of which are shown in the various figures. In other embodiments, method 600 is performed by a global clock recovery circuit. Method 600 is not limited by the particular type of apparatus or software element performing the method. The various actions in method 600 may be performed in the order presented, or may be performed in a different order. Further, in some embodiments, some actions listed in FIG. 6 are omitted from method 600.

Method 600 is shown beginning at block 610 in which a reference clock signal is received. In some embodiments, this may correspond to a reference clock being received by a phase/frequency detector such as PFD 312 (FIGS. 3,4), and in other embodiments, this may correspond to a reference clock being received by a frequency detector such as FD 512 (FIG. 5). At 620, a training sequence is received on a plurality of data input nodes. For example, in some embodiments, a known training sequence may be transmitted from one integrated circuit to data input nodes in another integrated circuit.

At 630, a clock frequency is recovered from a clock signal. In some embodiments, this may correspond to a global clock recovery circuit such as one of global clock recovery circuits 310 (FIG. 3), 410 (FIG. 4), or 510 (FIG. 5) producing one or more clock signals having a frequency recovered from a reference clock signal. At 640, a separate static phase adjustment is determined for each of the plurality of data input nodes. In some embodiments, the separate static phase adjustments may be determined by a finite state machine such as FSM 320 (FIG. 3), 420 (FIG. 4), or 520 (FIG. 5). At 650, the static phase adjustments are stored in storage elements. In some embodiments, this may correspond to programming storage elements such as storage elements 466 and 476 (FIG. 4). In other embodiments, this may correspond to programming a storage element in a finite state machine such as FSM 320 (FIG. 3), 420 (FIG. 4), or 520 (FIG. 5).

In some embodiments, the acts of blocks 640 and 650 are performed during an initialization phase of a circuit or system. For example, when power is applied to a system, static phase adjustments may be determined and programmed into storage elements for use in an operational phase of the circuit or system. Also in some embodiments, the acts of blocks 640 and 650 may be performed periodically as part of a calibration operation. For example, static phase adjustments may be determined and programmed into storage elements on a periodic basis.

At 660, a common dynamic phase adjustment is determined. In some embodiments, common dynamic phase adjustment information is determined by a finite state machine that receives phase offset information from multiple sources. For example, a finite state machine in a global clock recovery circuit may receive phase offset information from multiple loop circuits. The finite state machine may average the phase offset information to determine a common phase adjustment.

At 670, the common dynamic phase adjustment is summed with the static phase adjustments to adjust a clock phase for each of the plurality of data input nodes. In some embodiments, an adder sums the common dynamic phase adjustment with the static phase adjustment for each data input node, and in other embodiments, a finite state machine performs the summation. In still further embodiments, a clock interpolator circuit sums the static and dynamic phase adjustment information. The resulting sum of static and dynamic phase adjustment information is then used to determine a clock signal for each data input node. For example, as shown in FIGS. 3-5, clock signals CLK0 and CLK1 are generated by interpolator circuits that receive a combination of static phase adjustment information and dynamic phase adjustment information.

Figure 7:
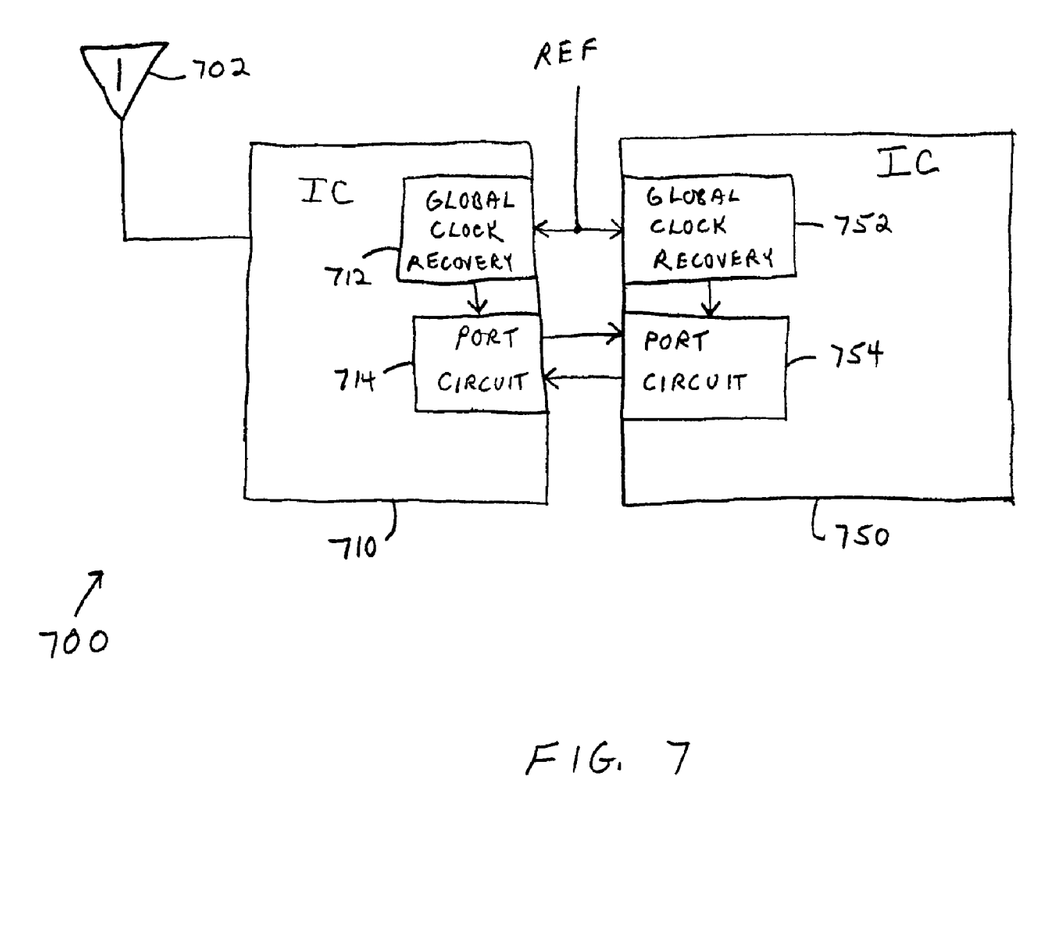
FIG. 7 shows a system diagram in accordance with various embodiments of the present invention.

FIG. 7 shows a system diagram in accordance with various embodiments of the present invention. FIG. 7 shows system 700 including integrated circuits 710 and 750, and antenna 702. In operation, system 700 receives a signal using antenna 702, and the signal is processed by the various elements shown in FIG. 7. Antenna 702 may be a directional antenna or an omni-directional antenna. As used herein, the term omni-directional antenna refers to any antenna having a substantially uniform pattern in at least one plane. For example, in some embodiments, antenna 702 may be an omni-directional antenna such as a dipole antenna, or a quarter wave antenna. Also for example, in some embodiments, antenna 702 may be a directional antenna such as a parabolic dish antenna or a Yagi antenna.

Integrated circuits 710 and 750 can be any type of integrated circuit capable of including one or more global clock recovery circuits or port circuits as shown. For example, either integrated circuit 710 or 750 may be a processor such as a microprocessor, a digital signal processor, a microcontroller, or the like. Either integrated circuit may also be an integrated circuit other than a processor such as a radio frequency (RF) receiver, transmitter, or transceiver, an application-specific integrated circuit (ASIC), a communications device, a memory controller, or a memory such as a dynamic random access memory (DRAM). For ease of illustration, portions of integrated circuits 710 and 750 are not shown. The integrated circuits may include much more circuitry than illustrated in FIG. 7 without departing from the scope of the present invention.

Some embodiments include an RF receiver, transmitter, or transceiver coupled between antenna 702 and integrated circuit 710. For example, in some embodiments, an RF receiver receives the signal and performs "front end" processing such as low noise amplification (LNA), filtering, frequency conversion or the like.

Systems represented by the various foregoing figures can be of any type. Examples of represented systems include computers (e.g., desktops, laptops, handhelds, servers, tablets, web appliances, routers, etc.), wireless communications devices (e.g., cellular phones, cordless phones, pagers, personal digital assistants, etc.), computer-related peripherals (e.g., printers, scanners, monitors, etc.), entertainment devices (e.g., televisions, radios, stereos, tape and compact disc players, video cassette recorders, camcorders, digital cameras, MP3 (Motion Picture Experts Group, Audio Layer 3) players, video games, watches, etc.), and the like.

Global clock recovery circuits, port circuits, loop circuits, and other embodiments of the present invention can be implemented in many ways. In some embodiments, they are implemented in integrated circuits as part of data interfaces. In some embodiments, design descriptions of the various embodiments of the present invention are included in libraries that enable designers to include them in custom or semi-custom designs. For example, any of the disclosed embodiments can be implemented in a synthesizable hardware design language, such as VHDL or Verilog, and distributed to designers for inclusion in standard cell designs, gate arrays, or the like. Likewise, any embodiment of the present invention can also be represented as a hard macro targeted to a specific manufacturing process.

Although the present invention has been described in conjunction with certain embodiments, it is to be understood that modifications and variations may be resorted to without departing from the spirit and scope of the invention as those skilled in the art readily understand. Such modifications and variations are considered to be within the scope of the invention and the appended claims.

What is claimed is:

1. An apparatus comprising:
a first loop circuit to receive a reference clock and produce at least one internal clock signal;
a plurality of second loop circuits, wherein each of the plurality of second loop circuits is coupled to receive the at least one internal clock signal and a data signal, and to provide a phase offset indication; and a finite state machine to receive the phase offset indication from each of the plurality of second loop circuits, and to provide phase adjustment information to each of the plurality of second loop circuits;

wherein each of the plurality of second loop circuits include a storage element to hold static phase adjustment information, and wherein the first loop circuit comprises a frequency locked loop circuit, and the finite state machine is coupled to the frequency locked loop circuit to provide dynamic phase adjustment information.

2. The apparatus of claim 1 wherein each of the plurality of second loop circuits includes a phase detector to provide the phase offset indication.

3. The apparatus of claim 1 wherein the first loop circuit includes a voltage controlled oscillator to provide a plurality of internal clock signals.

4. The apparatus of claim 3 wherein each of the plurality of second loop circuits includes an interpolator to interpolate between the plurality of internal clock signals.

5. An integrated circuit comprising:
a port circuit including a plurality of loop circuits to receive a plurality of data signals; and
a global clock recovery circuit coupled to receive a reference signal and to recover a clock frequency from the reference signal, and further coupled to receive phase offset information from each of the plurality of loop circuits;
wherein the global clock recovery circuit includes a phase locked loop to create a plurality of clock signals having a fixed phase relationship with respect to each other, and wherein each of the plurality of loop circuits includes an interpolator circuit to interpolate between the plurality of clock signals, and wherein each of the plurality of loop circuits further includes a phase detector to provide the phase offset information, and wherein the phase detector is coupled to receive a data signal and an output of the interpolator, and wherein the global clock recovery circuit comprises a finite state machine to receive the phase offset information from each of the plurality of loop circuits, and wherein the finite state machine averages the phase offset information and provides a result to each of the plurality of loop circuits.

6. A method comprising:
receiving a reference clock signal;
receiving a training sequence on a plurality of data input nodes;
recovering a clock frequency from the reference clock signal;
determining a separate static phase adjustment for each of the plurality of data input nodes, the static phase adjustment for a clock signal to clock a data signal on each of the plurality of data input nodes;
programming at least one storage element corresponding to each of the plurality of data input nodes; and
determining a common dynamic phase adjustment to combine with the separate static phase adjustments.

7. The method of claim 6 wherein determining a common dynamic phase adjustment comprises averaging phase offset information received from circuits coupled to each of the plurality of data input nodes.

8. An apparatus comprising:
a first loop circuit to receive a reference clock and produce at least one internal clock signal;
a plurality of second loop circuits, wherein each of the plurality of second loop circuits is coupled to receive the at least one internal clock signal and a data signal, and to provide a phase offset indication; and
a finite state machine to receive the phase offset indication from each of the plurality of second loop circuits, and to provide phase adjustment information to each of the plurality of second loop circuits;
wherein each of the plurality of second loop circuits include a storage element to hold static phase adjustment information, and wherein each of the plurality of second loop circuits include an adder to sum the static phase adjustment information with dynamic phase adjustment information provided by the finite state machine.

9. The apparatus of claim 8 wherein each of the plurality of second loop circuits includes a phase detector to provide the phase offset indication.

10. The apparatus of claim 8 wherein the first loop circuit includes a voltage controlled oscillator to provide a plurality of internal clock signals.

11. The apparatus of claim 10 wherein each of the plurality of second loop circuits includes an interpolator to interpolate between the plurality of internal clock signals.

12. An integrated circuit comprising:
a port circuit including a plurality of loop circuits to receive a plurality of data signals; and
a global clock recovery circuit coupled to receive a reference signal and to recover a clock frequency from the reference signal, the global clock recovery circuit including a circuit to receive and average phase offset information from each of the plurality of loop circuits, and to provide a result to each of the plurality of loop circuits.

13. The integrated circuit of claim 12 wherein the global clock recovery circuit includes a phase locked loop to create a plurality of clock signals having a fixed phase relationship with respect to each other.

14. The integrated circuit of claim 13 wherein each of the plurality of loop circuits includes an interpolator circuit to interpolate between the plurality of clock signals.

15. The integrated circuit of claim 14 wherein each of the plurality of loop circuits further includes a phase detector to provide the phase offset information.

16. The integrated circuit of claim 15 wherein the phase detector is coupled to receive a data signal and an output of the interpolator.

* * * * *